US006830830B2

(12) United States Patent
Hsieh et al.

(10) Patent No.: US 6,830,830 B2
(45) Date of Patent: Dec. 14, 2004

(54) SEMICONDUCTING HOLE INJECTION MATERIALS FOR ORGANIC LIGHT EMITTING DEVICES

(75) Inventors: Bing R. Hsieh, Webster, NY (US); Xiao-Chang Li, Ewing, NJ (US); Alan Sellinger, Menlo Park, CA (US); Ghassan E. Jabbour, Tucson, AZ (US)

(73) Assignee: Canon Kabushiki Kaisha, Tokyo (JP)

( * ) Notice: Subject to any disclaimer, the term of this patent is extended or adjusted under 35 U.S.C. 154(b) by 59 days.

(21) Appl. No.: 10/124,236

(22) Filed: Apr. 18, 2002

(65) Prior Publication Data

US 2003/0207152 A1 Nov. 6, 2003

(51) Int. Cl.$^7$ .............................................. H05B 33/14
(52) U.S. Cl. ...................... 428/690; 428/917; 313/504; 313/506
(58) Field of Search ................................ 428/690, 917, 428/332; 313/504, 506; 252/500, 519.3

(56) References Cited

U.S. PATENT DOCUMENTS

| | | |
|---|---|---|
| 3,963,769 A | 6/1976 | Fukunaga |
| 4,005,091 A | 1/1977 | Fukunaga ................... 260/286 |
| 4,055,091 A | 10/1977 | Fukunaga |
| 4,338,222 A | 7/1982 | Limburg et al. |
| 5,549,851 A | 8/1996 | Fukushima et al. |
| 5,587,224 A | 12/1996 | Hsieh et al. |
| 5,719,467 A * | 2/1998 | Antoniadis et al. ......... 313/506 |
| 5,834,080 A | 11/1998 | Mort et al. |
| 5,853,906 A | 12/1998 | Hsieh |
| 5,968,674 A | 10/1999 | Hsieh et al. |
| 5,976,418 A | 11/1999 | Fuller et al. |
| 6,107,439 A | 7/2000 | Yanus et al. |
| 6,139,999 A | 10/2000 | Fuller et al. |
| 6,197,462 B1 | 3/2001 | Yanus et al. |
| 6,517,958 B1 * | 2/2003 | Sellinger et al. ............ 428/690 |

FOREIGN PATENT DOCUMENTS

| | | |
|---|---|---|
| EP | 1 089 361 A2 * | 4/2001 |
| GB | 74/44704 | 10/1974 |
| JP | 10-284252 | * 10/1998 |

OTHER PUBLICATIONS

Ganzorig, Chimed, et al. Applied Physics Letters, vol. 77, No. 25, Dec. 18, 2000, pp. 4211–4213.*
Goodson et al., Journal of the American Chemical Society, (1999), vol. 121, pp. 7527–7539.*
Tamaki et al., Journal of the American Chemical Society (2001), vol. 123, pp. 12416–12417.*
Feher et al., Chemical Communications, (1998), pp. 1469–1470.*
Yoshihisa Yamamoto, et al., "The Electrical Properties of the Poly(N–Vinyl Carbazol)–Antimony(V) Chloride (or Iodine) Charge Transfer Complexes", Bull. Chem. Soc. Japan, vol. 38, No. 11, Nov. 1965, pp. 2015–2017.
H. Block, et al., "Conductivities of Poly(N–Vinyl Carbazoles) Containing Cation–Radicals", Polymer, vol. 18, No. 8, Aug. 1977, pp.781–785.
H. Block, et al., "Photoconductivities of Poly(N–Vinyl Carbazoles) Containing Cation Radicals", Polymer, vol. 19, No. 5, May 1978, pp. 531–536.
J. Mort, et al., "Chemical Control of Conductivity in a Molecularly–Doped Polym r", Jour. Elec. Mat rials, vol. 9, No 2, 1980, pp. 411–418.
R. H. Partridge, "Electroluminescence From Polyvinylcarbazole Films: 1. Carbazole Cations", Polymer, vol. 24, No. 6, Jun. 1983, pp. 733–738.
R. H. Partridge, "Electroluminescence From Polyvinylcarbazole Films: 2. Polyvinyl carbazole Films Containing Antimony Pentachloride", Polymer, vol. 24, No. 6, Jun. 1983 pp. 739–747.
R. H. Partridge, "Electroluminescence From Polyvinylcarbazole Films: 3. Electroluminescent Devices", Polymer, vol. 24, No. 6, Jun. 1983, pp. 748–754.
R. H. Partridge, "Electroluminescence From Polyvinylcarbazole Films: 4. Electroluminescence Using Higher Work Function Cathodes", Polymer, vol. 24, N . 6, Jun. 1983, pp. 755–762.
Asuka Yamamori, et al., "Doped Organic Light Emitting Diodes Having a 650–nm–Thick H Transport Layer", Applied Physics Letters, vol. 72, No. 17, Apr. 27, 1998, pp. 2147–2149.

* cited by examiner

*Primary Examiner*—Dawn Garrett
(74) *Attorney, Agent, or Firm*—Fitzpatrick, Cella Harper & Scinto (57) ABSTRACT

The invention is directed to oxidized charge transport materials having hole transport capability in organic light emitting device (OLEDs). A charge transport compound including more than two triarylamine groups, or including at least one triarylamine group and at least one fluorene group, is partly complexed with an oxidant, such as a Lewis acid, preferably present in an amount between 0.2 and 20 percent by weight. The resulting charge transport materials exhibit good hole transport characteristics and film forming properties.

2 Claims, 1 Drawing Sheet

Figure 1

SEMICONDUCTING HOLE INJECTION MATERIALS FOR ORGANIC LIGHT EMITTING DEVICES

BACKGROUND OF THE INVENTION

1. Field of the Invention

The present invention relates to oxidized charge transport materials which can form stable hole injection layers in organic light emitting devices without utilizing a polymeric binder.

2. Description of the Related Art

Organic light emitting devices (OLEDs) typically comprise a layer of emissive material between an anode and a cathode. When a bias is applied across the electrodes, positive charges (holes) and negative charges (electrons) are respectively injected from the anode and cathode into the emissive layer. The holes and the electrons form excitons in the emissive layer to emit light.

Electrodes are chosen to facilitate charge injection. An indium-tin-oxide (ITO) anode has a relatively high work function and is therefore suitable for use as a hole injection electrode, while low work function metals such as Al, Mg and Ca are suitable for injection of electrons.

To improve the power efficiency of an OLED, it is frequently desirable to enhance charge injection at the electrode interface. Recently it has been found that hole injection at the anode interface can be facilitated by using an oxidized charge transport (OCT) polymer as a hole injection layer in an OLED.

Addition of an oxidant to a charge transport polymer (such as polyvinyl carbazole) to give a semiconducting charge transfer polymer was first demonstrated in the 1960s. Thin films of these materials have been referred to as "oxidized transport layers" (OTLs). Conventional OTLs typically comprise a three-component coating: a charge transport molecule, an oxidized charge transport molecule, and a polymer binder. Different oxidant and charge transport molecule/polymer combinations have been developed and investigated for a wide range of applications. For example, U.S. Pat. No. 5,853,906, which is incorporated by reference herein, discloses conductive polymer compositions comprising an oxidized oligomer salt (including oxidized arylamines), a charge transport component and a polymeric binder, primarily for use in electrophotographic applications. Recently, OTLs have been investigated as a contact modification layer on the anode in OLED applications.

Organic EL devices with a hole injection layer formed from N,N'-diphenyl-N,N'-bis(3-methylphenyl)-1,1'-biphenyl-4,4'-diamine (TPD) doped with oxidizing reagents such as $I_2$, $FeCl_3$, $SbCl_5$ and tris(4-bromophenyl)aminium hexachloroantimonate (TBAHA) have also been disclosed.

A drawback of the known OTL systems is that they are unstable and cannot readily be incorporated into a device without utilizing a polymeric binder.

The most stable OTL known today is based on the cation radical salts of N,N,N',N'-tetra-p-tolyl-4,4'-biphenyldiamine (TM-TPD.$SbF_6$) having the structure:

TM—TPD·$SbF_6$

There continues to be a need in the art for hole injection materials exhibiting enhanced stability. There is a need in the art for OTLs fabricated with a variety of it triarylamine charge carriers. There is also a continued need for OTLs which can be formulated without a polymeric binder to form thicker and more robust hole injection layers which can be deposited by solvent processes such as spin coating.

SUMMARY OF THE INVENTION

In one aspect, the invention is an oxidized transport material formed substantially without a polymeric binder suitable for use as a hole injection layer in an OLED, comprising a charge transport compound having more than two triarylamine It groups, or having at least one triarylamine group and at least one fluorene group; and an oxidant complexed with said charge transport compound, wherein a portion of said charge transport compound is not complexed to the oxidant.

Advantageously, oxidant is present in the oxidized charge transport material in an amount between 0.2 and 20 percent by weight.

The oxidized transport material comprising the specified charge transport compounds is preferably fabricated as a thin layer in an organic light emitting device by solution processing, such as spin coating, without using a polymeric binder. Such layer generally has a thickness of about 50 Angstroms to about 50,000 Angstroms, preferably about 100 Angstroms to about 2,000 Angstroms. It is believed that the high molecular weight of the oligomeric charge transport compounds according to the invention provides these compounds with good film forming properties such that no polymeric binder is needed.

In another aspect, the invention is an organic light emitting device comprising an anode and a cathode with an emissive layer interposed between them, and between the anode and the emissive layer, a hole injection layer consisting essentially of charge transport compound having more than two triarylamine groups, or having at least one triarylamine group and at least one fluorene group; complexed with an oxidant, wherein a portion of said charge transport compound is not complexed with said This brief summary has been provided so that the nature of the invention may be understood quickly. A more complete understanding of the invention can be obtained by reference to the following detailed description of the preferred embodiment thereof in connection with the attached drawings.

DETAILED DESCRIPTION OF THE PREFERRED EMBODIMENTS

Devices according to the invention find use in display applications such as television screens, computer screens and image bar components for digital copiers and printers, although the invention is not limited to these uses.

Figure 1:
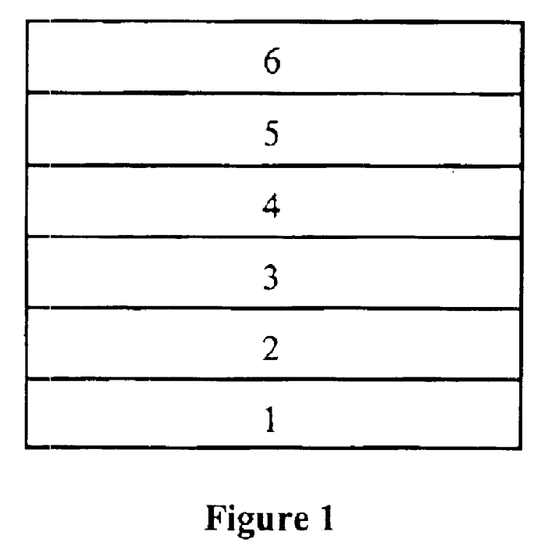
FIG. 1 is a schematic cross-sectional view of an EL device according to the invention.

FIG. 1 schematically depicts an OLED, including transparent substrate 1, anode 2 adjacent the substrate, a hole injection layer 3 comprising an OTL according to the invention adjacent the anode, emissive layer 4, optional electron transport layer 5 adjacent the emissive layer, and cathode 6. Each of these layers may itself comprise multiple layers of material having similar composition or function. Charge blocking layers (not shown) may also be used as known in the art. Functional layers may also be combined. For example, an emissive layer may be adapted to exhibit electron transport properties. Optional functional layers can be interposed between any two functional layers 1 through 6 without departing from the scope of the invention. For example, a buffer layer can be provided between the electrodes and the adjacent charge F transfer layers to suppress leakage currents.

OLEDs according to the invention may have a driving voltage between 0.1 V and 100 V, preferably between 1 V and 15 V, producing a current density at the anode/hole injection layer interface in a range of about 0.01 mA/cm$^2$ to about 1000 mA/cm$^2$.

Suitable materials for substrate 1 include glass, quartz and the like, and polymers (including, without limitation, polyesters, polycarbonates, polyacrylates, polymethacrylates, and polysulfones). The thickness of the substrate is not critical and can range, for example, from about 25 to over 1,000 microns, depending on the structural demands of the device.

The anode adjacent the substrate can be comprised of a metal, an alloy, an electroconducting compound, or mixtures thereof, with a work function equal to or greater than about 4.0 electron volts. Specific examples of anodes include hole injecting electrodes such as indium tin oxide (ITO), tin oxide, zinc oxide, gold, platinum, electrically conductive carbon, and conjugated polymers such as polyaniline, polypyrrole, and the like. ITO is preferred, as it has good transparency in visible light. The thickness of the anode can range anywhere from about 10 nanometers to 1 micron.

An OTL can be deposited adjacent the anode by vacuum deposition or solvent processing such as spin coating. The preferred method is spin coating. Accordingly, preferred charge transport compounds have good film forming properties so that they can be spin coated to the desired thickness.

A charge transport compound can be selected from triarylamine charge transport compounds. Preferred triarylamine compounds are oligomeric, incorporating at least three triarylamine groups, as in Figure (I):

(I)

Alternatively, oligomeric triarylamine charge transport compounds may incorporate one or more fluorene groups, and may be selected from Formulas (II) and (III), without limitation:

(II)

(III)

In still other preferred embodiments, between 2 and 8 hole-transporting aromatic amine groups may be incorporated onto a polyhedral silsesquioxane core moiety. Formulas (IV) and (V) below are exemplary of such an embodiment:

(IV)

-continued (V)

Still other charge transport compounds within the scope of the invention are selected from compounds which can be formed into a thin film in an OLED and which possess hole transport properties, including: oligothiophenes, tetraselenotetracenes, mono- and oligo-tetrathiafulvalenes, oligo-tetraselenotetracenes and oligometallocenes. Other suitable charge transport compounds which may be oxidized to form the thin-layer oxidized charge transport materials of the invention can be selected from those disclosed in the aforementioned U.S. Pat. No. 5,853,906.

To the charge transport compound is added an oxidant which complexes with the charge transport compound to form an oxidized charge transport compound.

Broadly speaking, any suitable oxidant may be used, including without limitation, $I_2$, $FeCl_3$, TBAHA, perfluoroacids, organic sulfonic acids, and Lewis acids. Lewis acids are preferred. In the more preferred embodiments the oxidant is selected from $M_mX_n$, where M is a metal selected from As, Sb, Au, Bi and P, and X is a halogen selected from F, Cl, and Br, and m and n are integers consistent with the valencies of the respective metal and halogen. The most preferred oxidant species are $SbF_6^-$, $AuCl_4^-$, and $AsF_6^-$.

Oxidant, as used herein, includes both the oxidizing species, such as the Lewis acid used to oxidize the charge transport compound, and the charged species complexed with the charge transport compound.

The weight percentage ratio of oxidant in the charge transport material is generally about 0.2 percent by weight to about 20 percent by weight (wt/wt) with respect to the charge transport material, and preferably between about 0.5 percent by weight and about 10.0 percent by weight.

An advantage of the present invention is that suitably thick and robust hole injection layers can be fabricated without a polymeric binder. The thickness of the OTL ranges from about 50 Angstroms to about 50,000 Angstroms, preferably from about 100 Angstroms to about 2,000 Angstroms. Very thin film hole injection layers, less than about 50 Angstroms, have been used to lower device driving voltages. However, these very thin films can develop pinholes, leading to device instability. On the other hand, films that are too thick may lead to high driving voltages.

Any type of emissive layer conventionally used in OLEDs may be employed with the novel OTLs according to the invention. Suitable luminescent materials for use in an OLED according to the invention include those formed of a conjugated organic host material, such as naphthalene, anthracene, phenanthrene, pyrene, benzopyrene, chrysene, picene, carbazole, fluorene, biphenyl, terphenyls, quarterphenyls, triphenylene oxide, dihalobiphenyl, trans-stilbene, and 1,4-diphenylbutadiene combined with a conjugated organic activating agent having condensed benzene rings, such as anthracene, tetracene, and pentacene. Combined electron transport/luminescent layers, such as tetraphenylbutadiene in polystyrene, and 4,4'-bis(5,7-di-t-pentyl-2-benzoxazolyl)-stilbene may also be used as a luminescent layer in an OLED according to the present invention. The reaction product of poly(N-vinyl carbazole) (PVCz) with a strong oxidizing agent, such as $SbCl_5$ and the like, have also been demonstrated to exhibit luminescent and semiconducting characteristics and may be formed into a film and used in an OLED according to the invention. Other known materials suitable for use as emissive layers in OLEDs include tris(8-hydroxyquinolate) aluminum ($AlQ_3$) complexes. Other metal complexes with heteroaromatic ligands, such as those disclosed in U.S. Pat. No. 5,925,472 (herein incorporated by reference), may also be used to form a luminescent layer in an OLED according to the invention. This list of potential luminescent layers is not exhaustive and many other alternative luminescent layers, hole-transport/luminescent layers, and electron-transport/luminescent layers, both currently available and being developed, can be used in an OLED according to the invention, as would be appreciated by those of skill in the art. It As used herein "emissive" is meant radiation emitting and "luminescent" means visible light emitting, whether due to an applied bias or otherwise. In the context of an OLED, an emissive layer and luminescent layer are used interchangeably. Accordingly an emissive layer is understood to include a hole transport/emissive layer and an electron transport/emissive layer.

Any electron injecting, electron transport, and electron transport/luminescent, hole transport/luminescent, charge blocking, or buffer layer known to be useful in OLED manufacture may be employed in an OLED according to the invention.

An important aspect of the invention is that thin films of hole injection material, suitable for use in an OLED can be made substantially without polymeric binder. By "substantially without polymeric binder" is meant that a stable, thin film layer can be formed without use of an inert, non-conductive polymer. Examples of polymeric resins used to facilitate formation of thin films in OLEDs are disclosed in U.S. Pat. No. 4,338,222, herein incorporated by reference. Examples of such inert, non-conductive resins include polycarbonates, polystyrene, polyolefins, polyesters, polyamides, polyacrylates, and polymethacrylates. "Substantially without" does not exclude small amounts of the foregoing inert, nonconductive polymers in a hole injection layer. "Substantially without" simply means that there is less than an amount necessary to impart film forming properties to a material that otherwise could not be deposited in a stable thin film in an OLED.

In preferred embodiments, the hole injection layer does not include any polymer (or any compound having more than 10 repeat units) at all. However, other layers in the OLED may include polymers.

EXAMPLE 1

To prepare an OTL material, 1 kg of a compound having the structure shown in Formula II, having fluorene units incorporated into a TPD structure (DF-TPD), and 50 g $AgSbF_6$ were dissolved in 1L dichloromethane and stirred for 2 hours. The black solution was filtered to remove the Ag particles. The filtrate was then dried under reduced pressure to form the black powder, DF-TPD•$SbF_6$, with a yield of 95%.

EXAMPLE 2

To prepare an OTL material based on the polyhedral silsesquioxane ("star-cube") core, a star-cube charge transport compound having the structure shown in Formula (V) (1 kg) and $AgSbF_6$ (50 g) were dissolved in dichloromethane (1L) and stirred for 4 hours. The black solution was filtered to remove the Ag particles. The filtrate was then dried under reduced pressure to form the black powder, star-cube•$SbF_6$, with a yield of 92%.

EXAMPLE 3

A device was prepared using the above star-cube•$SbF_6$ material by dissolving 200 mg of star-cube•$SbF_6$ in 1,2-dichlorobenzene (20 ml) to form a solution which is then filtered with a filter having a pore size less than 1.0 μm. The solution is spin-coated on a clean ITO glass substrate with a spin speed of 4,000 rpm to obtain a thin OTL coating of 50 nm. An emissive layer of AlQ3 (thickness of 80 nm) is then evaporated on top of the OTL layer. On top of the AlQ3 emissive layer is deposited a thin layer of Li (5 nm) and then an Al layer (180 nm) as a cathode. The device shows bright green electroluminescence under a bias voltage of 3.0 V. The device manufactured according to this process has lowered turn-on voltage than an otherwise similar device using a star-cube hole transport layer without $SbF_6$ as the oxidizing dopant, which exhibits a turn-on voltage of 4.5 V.

The foregoing examples are for illustration purposes and are not to be considered limiting of the invention, which is defined by the following claims.

We claim:

1. An oxidized charge transport material formed substantially without a polymeric binder, having hole transport capability in an organic light emitting device, comprising a charge transport compound including more than two triarylamine groups, or including at least one triarylamine group and at least one fluorene group, and an oxidant complexed with said charge transport compound, wherein a portion of said charge transport compound is not complexed with said oxidant; and wherein said charge transport compound has the following formula IV or V:

(IV)

(V)

2. An organic light emitting device comprising an anode, a cathode and an emissive layer between the anode and the cathode, and between the anode and the emissive layer, a hole injection layer formed without a polymeric binder and comprising a charge transport compound including more than two triarylamine groups. or including at least one triarylamine group and at least one fluorene group, complexed with an oxidant, wherein a portion of said charge transport compound is not complexed with said oxidant; and wherein said charge transport compound in the hole injection layer is:

or

* * * * *

UNITED STATES PATENT AND TRADEMARK OFFICE
CERTIFICATE OF CORRECTION

PATENT NO. : 6,830,830 B2
DATED : December 14, 2004
INVENTOR(S) : Bing R. Hsieh et al.

It is certified that error appears in the above-identified patent and that said Letters Patent is hereby corrected as shown below:

Column 2,
Lines 19 and 30, "it" should be deleted;
Line 57, "said" should read -- said oxidant --.

Column 3,
Line 26, "F" should be deleted.

Column 7
Formula (V) should read as follows:

--

(V)

--

UNITED STATES PATENT AND TRADEMARK OFFICE
CERTIFICATE OF CORRECTION

PATENT NO. : 6,830,830 B2
DATED : December 14, 2004
INVENTOR(S) : Bing R. Hsieh et al.

It is certified that error appears in the above-identified patent and that said Letters Patent is hereby corrected as shown below:

Column 9,
Line 67, "It" should be deleted.

Signed and Sealed this

Twenty-fourth Day of May, 2005

JON W. DUDAS
*Director of the United States Patent and Trademark Office*